United States Patent [19]

Cho et al.

[11] 4,021,276
[45] May 3, 1977

[54] METHOD OF MAKING RIB-STRUCTURE SHADOW MASK FOR ION IMPLANTATION

[75] Inventors: Kon Ho Cho, West Windsor Township, Mercer County; Peter David Parry, Montgomery Township, Somerset County, both of N.J.

[73] Assignee: Western Electric Company, Inc., New York, N.Y.

[22] Filed: Dec. 29, 1975

[21] Appl. No.: 645,146

[52] U.S. Cl. .............................. 156/644; 148/187; 156/645; 156/661; 428/134; 428/137; 428/156
[51] Int. Cl.² .......................................... H01L 7/50
[58] Field of Search ................ 156/3, 6, 8, 11, 17, 156/16; 29/580, 583; 428/131, 134, 135, 137, 156; 148/186, 187

[56] References Cited

UNITED STATES PATENTS 3,713,922  1/1973  Lepselter .......................... 156/17 X

*Primary Examiner*—William A. Powell
*Attorney, Agent, or Firm*—M. Y. Epstein; G. D. Green

[57] ABSTRACT

A shadow mask particularly useful in ion implantation processes is disclosed. The mask is fabricated by doping a surface region of a semiconductor wafer to render that region resistant to a particular etchant, machining cavities in the surface of the wafer opposite the doped surface to a depth that does not quite reach the doped region, forming pattern openings in the webs remaining across the ends of the cavities, and thinning the webs by exposure to the particular etchant until the undoped material in the webs is removed. Thus, the ultimate thickness of the webs is controlled substantially by the doping depth.

9 Claims, 6 Drawing Figures

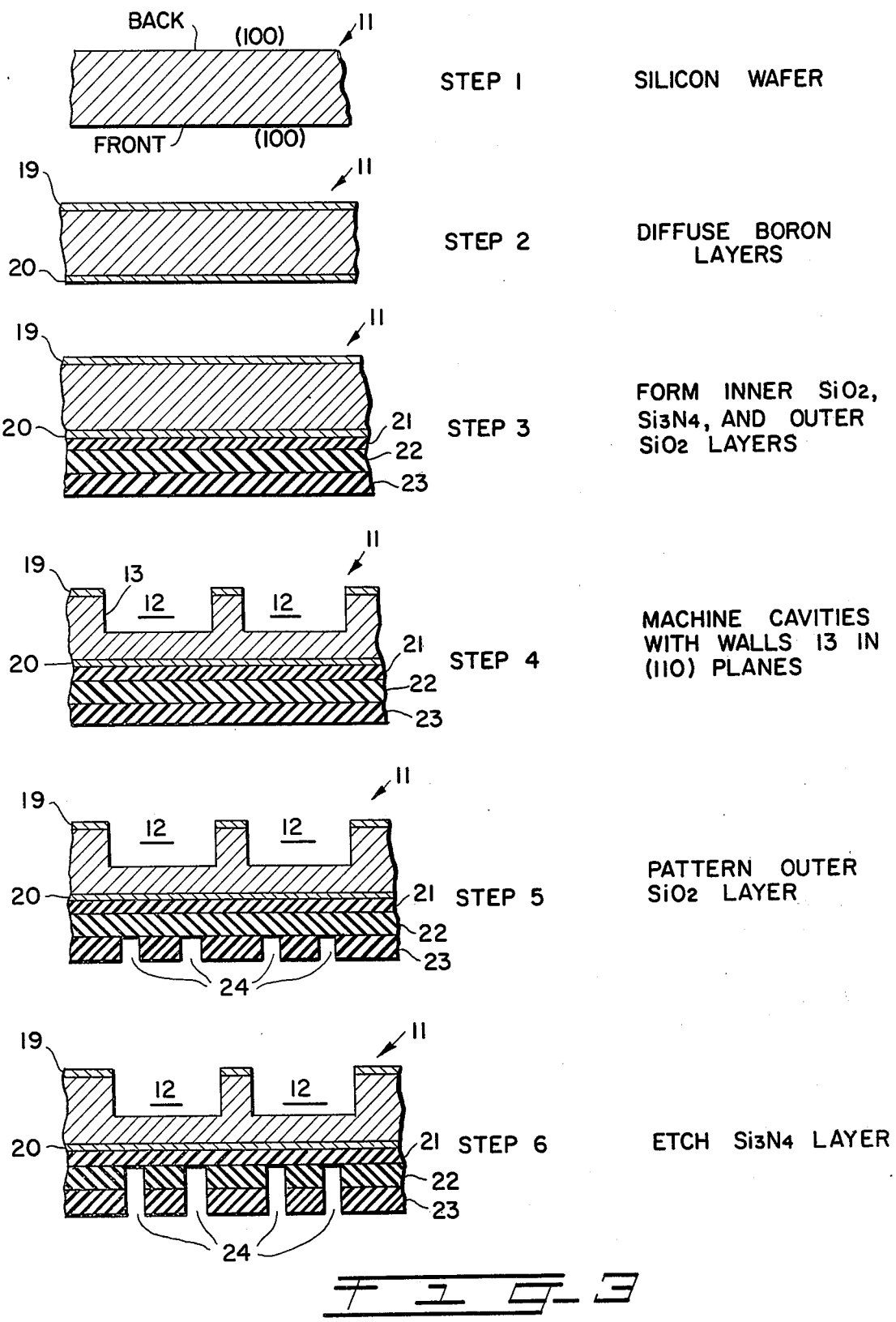

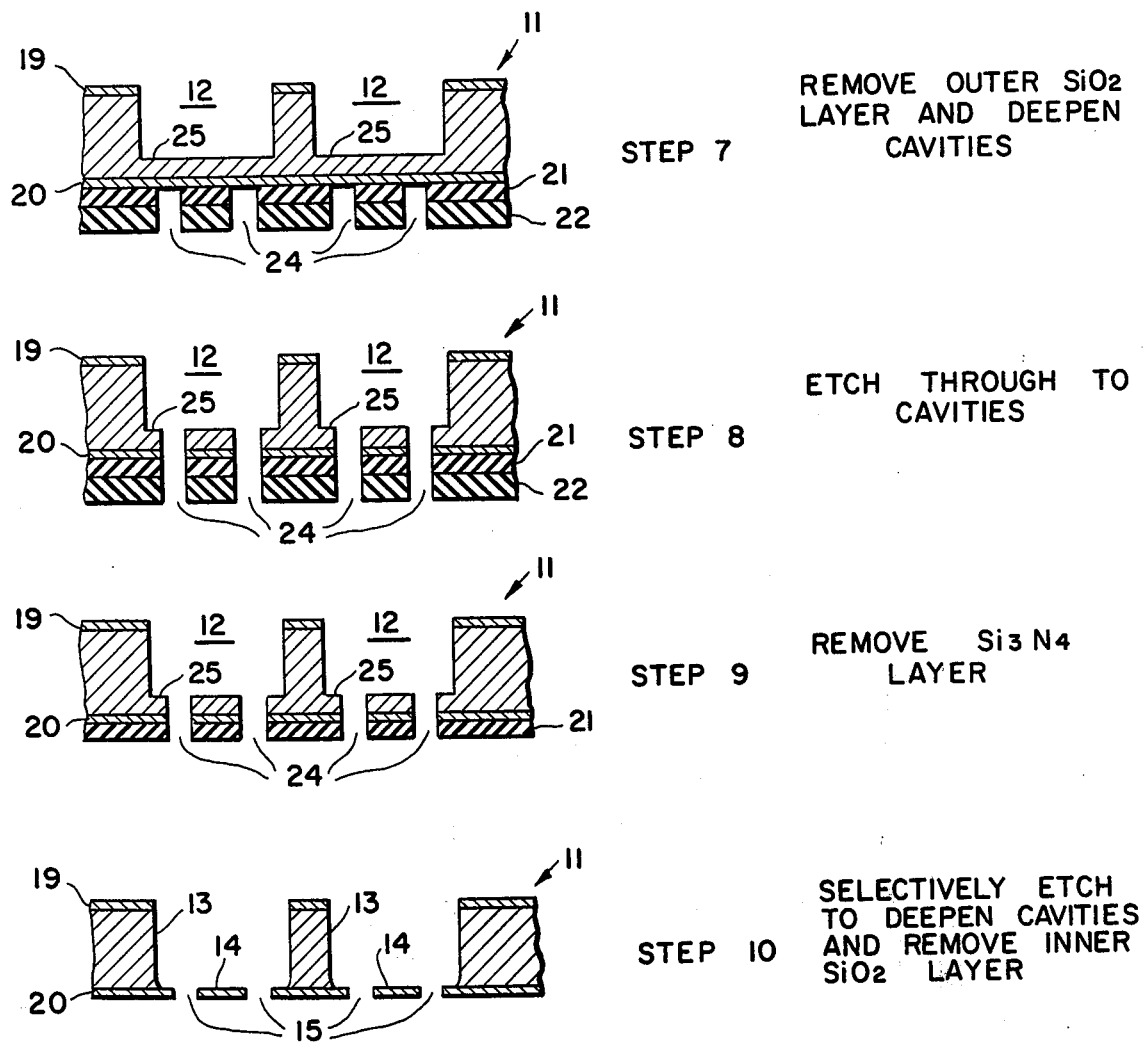
FIG. 3 (CONTD.)

U.S. Patent  May 3, 1977  Sheet 5 of 5  4,021,276
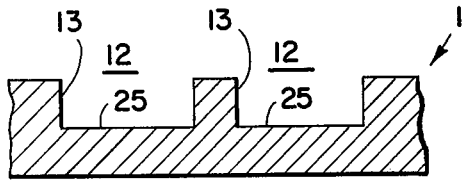
STEP 1    AS IN FIG. 3
STEP 4'    MACHINE CAVITIES WITH WALLS 13 IN (100) PLANES
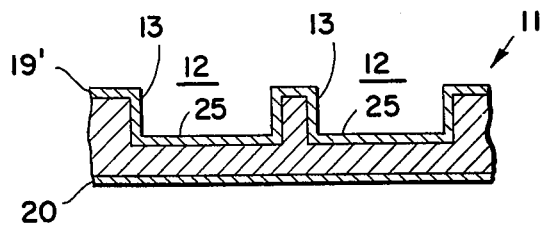
STEP 2    DIFFUSE BORON LAYERS
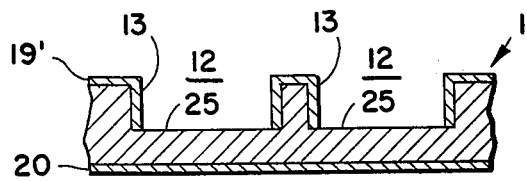
STEP 4"    MACHINE CAVITIES TO REMOVE BORON LAYERS IN FLOORS
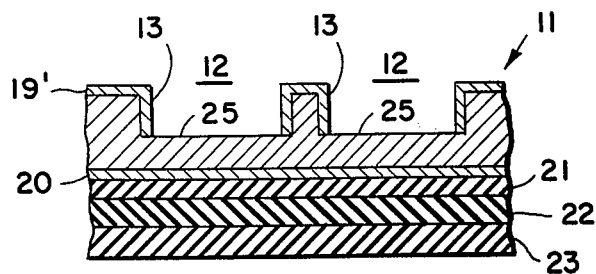
STEP 3    FORM INNER $SiO_2$, $Si_3N_4$, AND OUTER $SiO_2$ LAYERS
STEPS 5, 6, 7, 8, 9 AND 10 AS IN FIG. 3
FIG. 6

METHOD OF MAKING RIB-STRUCTURE SHADOW MASK FOR ION IMPLANTATION

BACKGROUND OF THE INVENTION

1. Field of the Invention

This invention relates to shadow masks and, more particularly, to a shadow mask for use in an ion implantation process.

2. Description of the Prior Art

In the manufacture of semiconductor devices, it is well known to use ion implantation processes to introduce dopants into regions of semiconductor chips comprising the active portions of the devices. Typically, a region to be implanted is defined by an opening in a mask, such as a silicon oxide or silicon nitride mask, grown on the surface of the semiconductor chip and usually removed after the implantation step. Such processing steps are typically performed on semiconductor wafers comprising numerous identical device chips that will be separated later.

It is also well known to use shadow masks in ion implantation processes to eliminate the need for forming a mask on each semiconductor wafer. A shadow mask is a stencil-like structure fabricated with a pattern of openings defining the region to be implanted. Such a shadow mask is positioned next to a semiconductor wafer when the wafer is being implanted and can be used repeatedly for implanting different wafers. An example of a prior art shadow mask for ion implantation is shown in U.S. Pat. No. 3,713,922 issued to Lepselter et al.

The portion of a shadow mask having the pattern-defining openings should be relatively thin, for example, less than 1 mil and preferably less than 10 $\mu$m, for high resolution patterns to be obtained in the implantation process. The mask should also have adequate mechanical strength to permit repeated handling, and high thermal capacity to prevent the mask from overheating during the implantation process. The latter two requirements indicate a relatively thick mask. These conflicting requirements can be met with a mask having relatively thick ribs in an intersecting grid pattern and relatively thin webs spanning the openings between the ribs, with the pattern openings in the webs. Each web typically comprises the pattern openings for one device chip.

One method of forming a grid-structured mask is by preferential etching, wherein the mask is fabricated from a silicon wafer by repeated ion implantation and preferential electrolytic etching steps for removing part of the wafter to define the ribs and the webs. Such a method is disclosed in the above-mentioned patent. However, this method is not practical for forming ribs that are extremely thick with respect to the webs, because the repeated implantation and etching steps take too much time, and result in ribs having tapered sides. The tapered ribs reduce the web area available for pattern openings, and such masks have lower thermal capacity and lower mechanical strength than is desired.

It is desired to produce a shadow mask having high mechanical strength and high thermal capacity, having relatively thick, non-tapered ribs, and relatively thin patterned webs between the ribs.

SUMMARY OF THE INVENTION

A shadow mask and a method of fabricating the shadow mask are disclosed. The shadow mask comprises a semiconductor wafer having a grid structure of cavities formed therein. The walls of the cavities are substantially perpendicular to the surfaces of the wafer; the ends of the cavities are closed by webs having pattern openings therein. The wafer can be at least 20 mils thick, and the webs can be less than 10 $\mu$m thick.

To fabricate the shadow mask from the semiconductor wafer, a region adjacent one surface of the wafer is highly doped to render that region etch-resistant in an etching process that preferentially etches the undoped portions of the wafer. Cavities are then machined into the other surface of the wafer, leaving a web at the bottom of each cavity that is thicker than the doped region. Next, the shadow mask pattern is defined by forming openings in the webs. Finally, the mask is subjected to the preferential etching process to reduce the thickness of the webs to substantially that of the doped region.

The shadow masks fabricated according to the invention are particularly suited for use in ion implantation processes.

These and other aspects of the invention will be apparent from the accompanying drawings and the detailed description.

BRIEF DESCRIPTION OF THE DRAWINGS

FIG. 3 is a diagram showing a cross section of a mask after each of various processing steps of the invention;

FIG. 6 is a diagram showing a cross section of the mask after each of various processing steps in an alternative sequence to that of FIG. 3.

DETAILED DESCRIPTION

Figure 1:
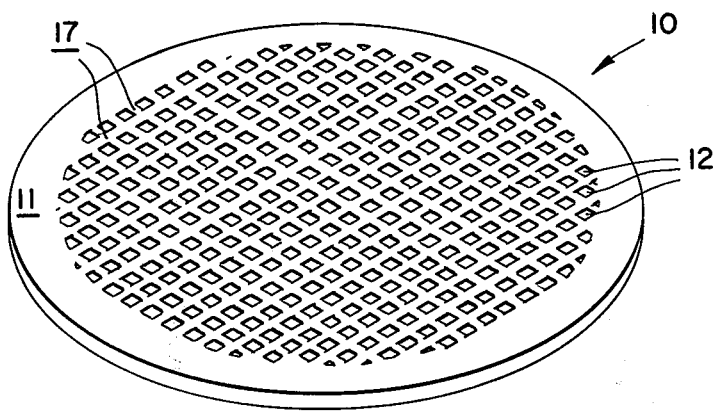
FIG. 1 is a pictorial view of a shadow mask fabricated by using the methods of the invention.
Figure 2:
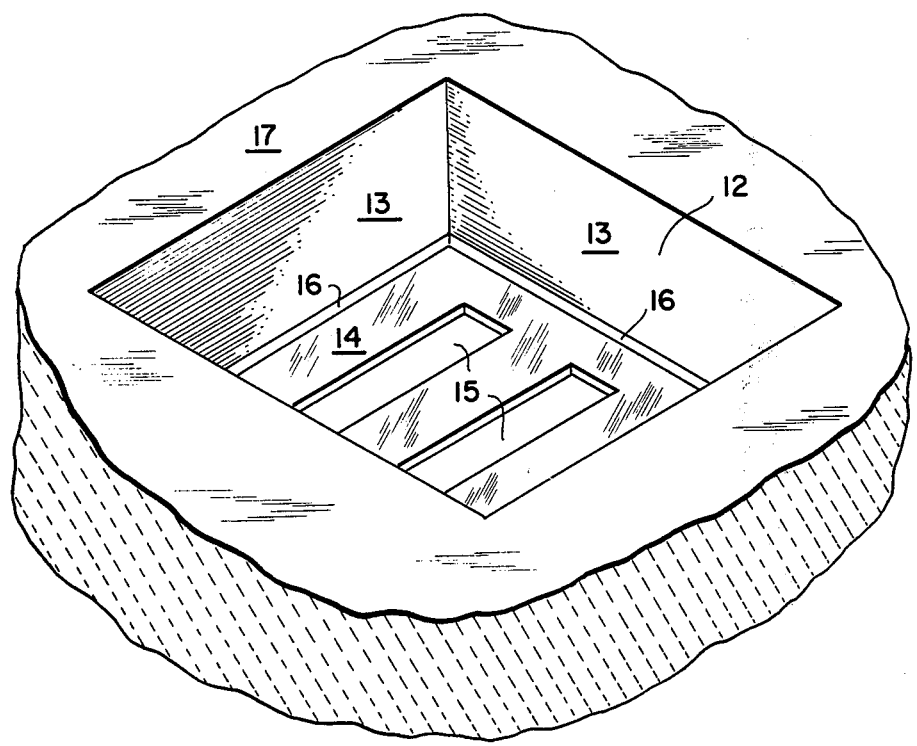
FIG. 2 is an enlargement of a portion of the mask shown in FIG. 1.

FIG. 1 shows a shadow mask fabricated by usng the methods of the invention. Mask 10 comprises wafer 11, for example, a silicon wafer, having cavities 12 formed therein. FIG. 2 is an enlarged view of one of cavities 12. Cavities 12 are shown to be square; however, the cavities can be other rectangular shapes. Shapes that are not rectangular are less desirable for cavities 12 because the walls of non-rectangular cavities cannot be oriented in preferred crystallographic planes.

Walls 13 of cavities 12 are substantially perpendicular to the surface of wafer 11. Web 14 extends across the bottom of the cavities, and comprises pattern openings 15 arranged in the pattern that the mask is intended to define. Fillet 16 extends around the edge of web 14 at the bottom of each cavity 12. As can be seen more clearly in FIG. 1, ribs 17 of wafer 11 between cavities 12 form a grid structure that is relatively thick with respect to the thickness of web 14. Web 14 can conceivably be as thin as 1 $\mu$m, and ribs 17 can be as thick as 250 mils. By using the methods described below, we have made masks with webs as thin as 3 $\mu$m and ribs 25 mils thick.

FIG. 3 shows a series of diagrammatic cross-sectional views of a portion of wafer 11 as the wafer is subjected to the various processing steps of the invention. These views are not to scale. Pertinent exemplary dimensions will be given as the steps are described.

In FIG. 3, step 1 shows wafer 11 as prepared for the subsequent steps. Wafer 11 can be silicon 20 mils thick with surfaces oriented in one of the (100) crystallographic planes. The front surface of wafer 11 is a smooth, polished surface that can be obtained, for example, by well known chemical-mechanical polishing processes, such as the Syton process of Monsanto Co. The front surface will be the outer surface of the web in the finished mask.

In step 2, boron is diffused into at least the front surface of wafer 11 to form diffused layer 20. The boron is diffused to form a concentration of about $2 \times 10^{20}$ atoms/cubic centimeter, which is almost the solid solubility limit of boron in silicon, down to a depth of typically 1$\mu$m to 10$\mu$m, depending on the desired web thickness. It is convenient during this step to also form a diffused boron layer 19 in the back of wafer 11. Layer 19 can serve as a protective layer in subsequent etching steps. Layers 19 and 20 can be diffused, for example, by placing the wafers between boron nitride discs in a diffusion furnace for 4 ½ hrs. at 1140° C. with a gas ambient of 5% $O_2$ and 95% $N_2$. As will be seen, the depth of diffusion determines the final thickness of web 14.

In step 3, three layers are grown or deposited on the front surface of wafer 11. Inner silicon dioxide ($SiO_2$) layer 21, in the range of 100 to 200 Angstrom units thick, is grown first. Then, silicon nitride ($Si_3N_4$) layer 22, about 2000 Angstrom units thick, is deposited. Finally, outer $SiO_2$ layer 23, also about 2000 Angstrom units thick, is deposited. The inner $SiO_2$ layer 21 can be grown by oxidizing the silicon substrate 11 in a wet oxidation ambient at 900° C. for 10 min. The ambient can be produced, for example, by bubbling $N_2$ through $H_2O$ at 80° C. The $Si_3N_4$ layer 22 can be deposited by a chemical vapor deposition (CVD) process at 770° C. for 30 min. wherein the vapor consists essentially of $N_2$, $SiH_4$, and $NH_3$ gases in a volume ratio of about 92,000:19:3,000. The outer $SiO_2$ layer 23 can also be deposited by a CVD process at 810° C. for 30 min. wherein the vapor consists essentially of $N_2$, $SiH_4$, and $N_2O$ gases in a volume ratio of about 120,000:16.5:2,000.

Figure 4:
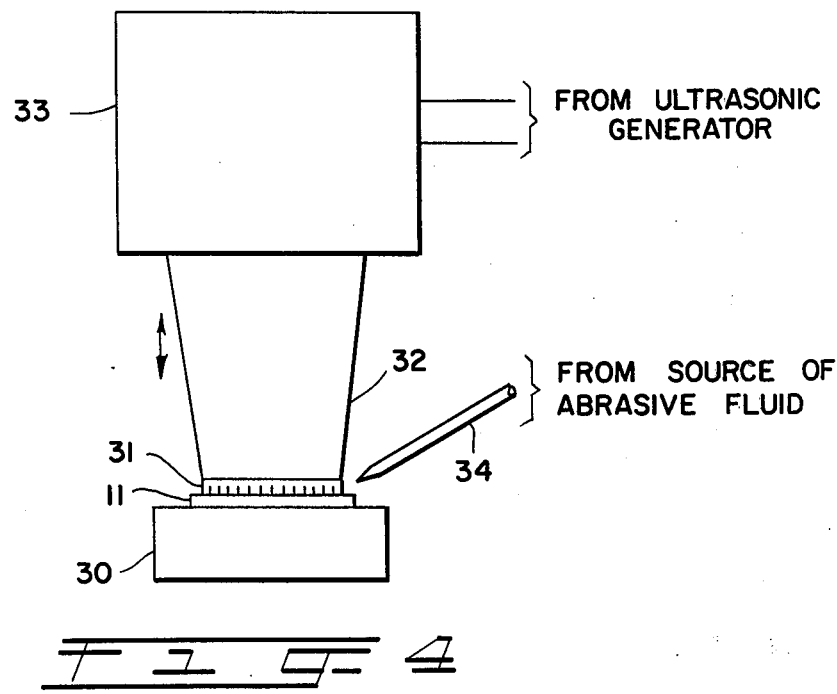
FIG. 4 is a diagram showing an ultrasonic cutting tool forming cavities in a semiconductor wafer, as in one of the processing steps of the invention.

In step 4, cavities 12 are partially machined in the back of wafer 11, for example, by an ultrasonic cutting process. Ultrasonic cutting is preferred for its ability to form non-tapered cavities. This process is diagrammed in FIG. 4. Referring to FIG. 4, wafer 11 is supported on holder 30. Cutting tool 31 attached to tool cone 32 touches wafer 11. Cutting tool 31 is shaped to have projections where cavities 12 are to be formed. An abrasive fluid, such as aluminum oxide particles suspended in water, is directed from a source (not shown) by nozzle 34 to the contact area between tool 31 and wafer 11. An ultrasonic generator (not shown) drives transducer 33 to move cutting tool 31 up and down at an ultrasonic rate, as indicated by the arrows. Cutting tool 31 is allowed to cut into wafer 11 until cavities 12 almost reach layer 20. For example, if wafer 11 is 20 mils thick, cavities 12 can be cut to a depth of about 18 mils during this step.

Depending on the orientation of cutting tool 31 with respect to wafer 11, walls 13 of rectangular cavities can be made (100) planes, (110) planes, or other higher order planes. It is preferred to orient tool 31 with respect to wafer 11 so that walls 13 are in (110) planes because of the slower etch rate of such planes in a subsequent etching step with respect to the (100) planes of the surfaces of wafer 11.

At this point in the mask-forming process, wafer 11 can be subjected to a low-temperature heat treatment step to increase the density of layers 21, 22, and 23 and to relieve stresses set up during ultrasonic cutting. This heat treatment should be performed at a temperature less than 1050° C. so that the boron will not be diffused farther into the wafer, and can comprise, for example, a 1000° C. 30 min. treatment in a diffusion furnace with a wet oxidation ambient, e.g., $N_2$ gas bubbled through water at 80° C.

Referring again to FIG. 3, in step 5, outer $SiO_2$ layer 23 is patterned with a positive version of the desired mask pattern to form windows 24. This patterning is accomplished using well known photolithographic techniques. For example, the surface of layer 23 is coated with a film of photoresist (not shown) 10,000 Angstrom units thick. A suitable photoresist is Eastman Kodak Company's KMER resist. The photoresist is exposed to light through a master mask incorporating the desired pattern, and developed by immersion into a developer such as Kodak's KMER developer to leave openings corresponding to the windows to be formed in layer 23. Then an etchant such as a buffered HF solution is directed at layer 23 through the photoresist mask to etch windows 24, and the photoresist is removed with a solvent such as Allied Chemical Company's A-20 photoresist stripping solution.

In step 6, inner $Si_3N_4$ layer 22 is patterned, using layer 23 as a mask, by directing an etchant such as phosphoric acid refluxed at 160° C. at the front surface of wafer 11. In step 7, outer $SiO_2$ layer 23 is removed by directing an etchant, such as potassium hydroxide (KOH), isopropyl alcohol (IPA) and water in a weight ratio of about 18:5:77, at 80° C., at layer 23. This etchant also removes the inner $SiO_2$ layer 21 in the regions, where patterns have been etched in the $Si_3N_4$ layer 22, and deepens cavities 12 by attacking the undoped silicon in ends 25 of the cavities. Up to this point, the various etchants used for processing layers 21 and 22 have been selective for theses layers, and have not affected the undoped silicon in ends 25 of the cavities. The etchant used in step 7 removes about half the remaining undoped silicon in ends 25. This etchant attacks the boron-doped silicon in layers 19 and 20 very slowly, so these layers are substantially unaffected by this step.

In step 8, widows 24 are etched through boron-doped layer 20, and ends 25 to open the windows into cavities 12. During this step, boron doped layer 19 in the back of wafer 11 is covered by a protective layer (not shown), for example, KMER photoresist. A suitable etchant for step 8 is a room temperature mixture of phosphoric acid ($H_3PO_4$), nitric acid ($HNO_3$) and hydrofluoric acid (HF) in a volume ratio of about 168:9:25.

In step 9, $Si_3N_4$ layer 24 is removed, for example, by etching in phosphoric acid, refluxed at 160° C. This etchant also removes inner $SiO_2$ layer 21 in the regions where it had been protected by the $Si_3N_4$ layer 24.

In step 10, cavities 12 are etched with an etchant, such as the KOH-IPA-water etchant used in step 7. This etchant etches silicon anisotropically. We have also found that this etchant etches silicon heavily doped with boron and oriented in one of the (100) planes much more slowly than undoped silicon oriented in one of the (100) planes. The approximate relative etch rates of undoped and doped silicon in the various planes are listed in Table I.

TABLE I
RELATIVE ETCH RATES OF SILICON IN AN ETCHANT CONSISTING OF POTASSIUM HYDROXIDE, ISOPROPYL ALCOHOL, AND WATER IN A WEIGHT RATIO OF ABOUT 18:5:77

| Planes | Undoped Si | Si doped with B to concentration of $2 \times 10^{20}$ atoms/cm$^3$ |
|---|---|---|
| (100) | 1 | 1/500 |
| (110) | 1/4 | 3/16 |
| (111) | 1/50 | 1/75 |

Thus, in steps 7 and 10, the KOH-IPA-water etchant rapidly etches undoped silicon along (100) planes as in ends 25 of cavities 12, but slowly etches boron-doped silicon in (100) planes, as in layers 19 and 20. The undoped silicon in walls 13 of cavities 12 etches at approximately one-fourth the rate of ends 25, since ends 25 are in (100) planes and walls 13 are in (110) planes. Etching is continued in step 10 until all silicon has been removed from cavities 12 except the boron-doped silicon in layer 20 and the undoped silicon in fillets 16 at the intersections of the walls of cavities 12 and layer 20. Fillets 16 form as etching proceeds since their surfaces are (111) planes, which are etched relatively slowly by the KOH-IPA-water etchant, as can be seen from Table I.

Boron-doped layer 20 thus becomes web 14 having a thickness controlled essentially by the depth of boron diffused in region 20 of wafer 11 during step 2.

Figure 5:
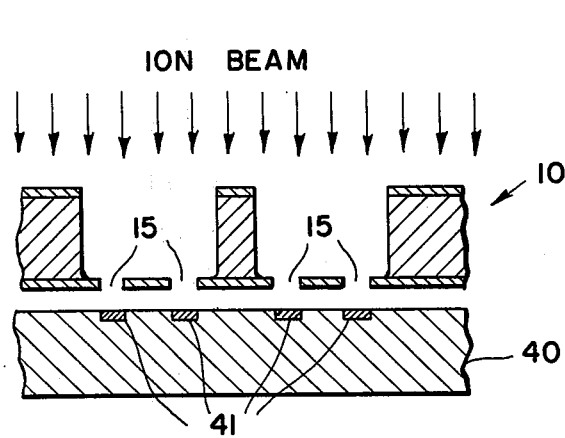
FIG. 5 is a diagram showing a shadow mask fabricated according to the method of the invention being used in an ion implantation process.

FIG. 5 shows mask 10 being used in an ion implantation process to define regions to be implanted in wafer 40. Mask 10 is positioned close to wafer 40. Ion beam 41 is directed at mask 10 and wafer 40. Ions passing through windows 15 in mask 10 are implanted in regions 41 in wafer 40. Ion implantation processes that could utilize mask 10 in such a manner are well known in the art.

Mask 10 is shown to be spaced slightly from wafer 40. This spacing is desirable to prevent damage to wafer 40 or mask 10 from debris or discontinuities on the adjacent surfaces of these elements. This spacing can be about 2 mils.

An alternative sequence of some of the above steps, plus an additional machining step, are shown in FIG. 6. Using the sequence of FIG. 6, walls 13 of cavities 12 are oriented in (100) planes and protected with a boron layer to prevent excessive undercutting during exposure of the walls to etchants that attack undoped silicon. With this protection, walls 13 will etch much more slowly than the (100) oriented material in ends 25, as can be seen from Table I.

In the alternative sequence shown in FIG. 6, wafer 11 is machined in step 4' before the boron layer is diffused and before oxide layers 21, 22, and 23 are formed. Tool 31 and wafer 11 must be oriented during step 4' so that walls 13 are in (100) planes instead of in (110) planes as in step 4 described above. After the machining step, boron layers 19' and 20 are diffused by performing step 2. Note that layer 19' follows walls 13 and ends 25 of cavities 12. Another brief machining step 4' is performed to slightly deepen cavities 12 and cut away the portions or boron layer 19' in ends 25 of cavities 12, but leaving layer 19' intact in walls 13. Step 3 is then performed to form the oxide layers. Because step 2 comprises exposing wafer 11 to a high temperature for a long period, e.g., 1140° C. for 4½ hours, this step also serves to relieve any stresses set up during machining. However, the low-temperature heat treatment step described earlier should still be performed after step 3 to increase the density of oxide layers 21, 22, and 23. Finally, steps 5–10, inclusive, as shown in FIG. 3, are performed to complete the mask.

As a simpler alternative to the use of oxide layers 21, 22, and 23 in the forming of openings 15, a patterned photoresist, such as Shipley Company's AZ1350H resist about 6,000 Angstrom units thick can be used directly to define openings 15 during etching step 8. However, this alternative does not give as good resolution in forming openings 15 as the above-described use of oxide layers 21, 22, and 23.

One skilled in the art may make changes and modifications to the embodiments of the invention disclosed herein, and may devise other embodiments, without departing from the spirit and scope of the invention.

What is claimed is:
1. A method of fabricating a shadow mask from a semiconductor wafer, which comprises:
   doping a first region adjacent one surface of the semiconductor wafer to render the first region etch-resistant in an etching process that preferentially etches the undoped portions of the wafer;
   machining a plurality of cavities into the other surface of the semiconductor wafer, leaving a web at the bottom of each cavity thicker than the first region, the walls of the cavities being substantially perpendicular to the surfaces of the wafer;
   forming openings in the webs to define the pattern for the shadow mask; and
   subjecting the wafer to the preferential etching process to reduce the webs to substantially the thickness of the first region.
2. The method of claim 1, which further comprises:
   before the machining step, doping a second region adjacent the other surface of the semiconductor wafer to render the second region etch-resistant in the etching process.
3. The method of claim 2 wherein the wafer is silicon having surfaces oriented in (100) crystallographic planes, the cavities are rectangular with walls oriented in (110) crystallographic planes, the first and second regions are doped with boron to a concentration of about $2 \times 10^{20}$ atoms per cubic centimeter, and the etchant in the etching process consists of potassium hydroxide, iospropyl alcohol, and water in a weight ratio of about 18:5:77.
4. The method of claim 3 wherein the wafer is at least 20 mils thick and the boron is diffused into the first and second regions to a depth less than 10μm.
5. The method of claim 1, which further comprises:
   doping the walls of the machined cavities to render the walls etch-resistant in the etching process.
6. The method of claim 1 wherein the machining step comprises ultrasonic cutting.
7. A method of fabricating a shadow mask from a silicon wafer having surfaces oriented in (100) crystallographic planes, which comprises:
   machining a plurality of rectangular cavities into a first surface of the wafer, leaving a web at the bottom of each cavity, the walls of the cavities being substantially perpendicular to the surfaces of the wafer and being oriented in (100) crystallographic planes;

doping a first region of the wafer adjacent the first surface, the walls of each cavity, and the surface of the web at the bottom of each cavity, and a second region of the wafer adjacent the second surface with boron to a concentration of about $2 \times 10^{20}$ atoms per cubic centimeter, the depth of doping being less than half the thickness of the web; F machining the webs at the bottom of the cavities to remove the portions of the first region in the webs;

forming openings in the webs to define the pattern for the shadow mask; and subjecting the wafer to an etchant consisting of potassium hydroxide, isopropyl alcohol and water in a weight ratio of about 18:5:77 to reduce the thickness of the webs to substantially the thickness of the second doped region.

8. The method of claim 7 wherein the machining steps comprise ultrasonic cutting.

9. The method of claim 7 wherein the wafer is at least 20 mils thick and the boron is diffused into the first and second regions to a depth less than $10 \mu m$.

* * * * *